United States Patent
Gao

(10) Patent No.: US 9,853,251 B2
(45) Date of Patent: Dec. 26, 2017

(54) ARRAY SUBSTRATE, OLED DISPLAY PANEL AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Zhiyang Gao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/248,127

(22) Filed: Aug. 26, 2016

(65) Prior Publication Data

US 2017/0237034 A1    Aug. 17, 2017

(30) Foreign Application Priority Data

Feb. 15, 2016    (CN) .......................... 2016 1 0086155

(51) Int. Cl.
*H01L 51/52* (2006.01)
*H01L 27/32* (2006.01)

(52) U.S. Cl.
CPC ........ *H01L 51/529* (2013.01); *H01L 27/3246* (2013.01); *H01L 27/3258* (2013.01); *H01L 51/5206* (2013.01)

(58) Field of Classification Search
CPC .............. H01L 51/529; H01L 51/5206; H01L 27/3246; H01L 27/3258
See application file for complete search history.

(56) References Cited

U.S. PATENT DOCUMENTS

| | | | |
|---|---|---|---|
| 7,352,582 B2* | 4/2008 | Yokoyama | H01L 51/5243 361/679.48 |
| 8,318,599 B2* | 11/2012 | Nakagawa | H01L 21/76801 257/788 |
| 8,890,196 B2* | 11/2014 | Zimmerman | H01L 33/64 257/103 |
| 8,980,697 B2* | 3/2015 | Yamada | H01L 21/78 257/685 |
| 9,318,727 B2* | 4/2016 | Goeoetz | H01L 51/529 |
| 9,362,470 B2* | 6/2016 | Schmidtke | H01L 33/56 |
| 2009/0039272 A1* | 2/2009 | Krummacher | H01L 27/322 250/370.01 |
| 2011/0096504 A1* | 4/2011 | Hild | H01L 51/529 361/704 |
| 2013/0207148 A1* | 8/2013 | Krauter | H01L 33/50 257/98 |
| 2016/0157334 A1* | 6/2016 | Koukami | H01L 23/3737 361/705 |

* cited by examiner

*Primary Examiner* — William Coleman
(74) *Attorney, Agent, or Firm* — Ladas & Parry LLP

(57) ABSTRACT

An array substrate, an organic light-emitting diode (OLED) display panel and a display device are provided. The array substrate includes a base substrate; a plurality of organic light-emitting diode (OLED) elements disposed on the base substrate; and a non-conductive layer in contact with the OLED elements, heat-conducting particles being doped in the non-conductive layer.

19 Claims, 1 Drawing Sheet

US 9,853,251 B2

ARRAY SUBSTRATE, OLED DISPLAY PANEL AND DISPLAY DEVICE

TECHNICAL FIELD

The present disclosure relates to an array substrate, an organic light-emitting diode (OLED) display panel and a display device.

BACKGROUND

Organic light-emitting diode (OLED) display is a self-luminescent display. Compared with a liquid crystal display (LCD), the OLED display does not require a backlight and hence is lighter and thinner. In addition, the OLED display is more and more applied in various high-performance display fields due to the advantages of high brightness, low power consumption, wide viewing angle, high response speed, wide service temperature range, etc.

However, an OLED display panel is a core component of the conventional OLED display and formed by encapsulating an OLED array substrate and a package substrate. The OLED array substrate includes a plurality of OLED elements. But the luminous efficiency of the OLED elements cannot reach 100%, namely electric energy injected into the OLED elements cannot be completely converted into optical energy, and most electric energy is converted into the optical energy. Therefore, after long-term operation of the OLED elements, a large amount of produced heat will be gathered on the OLED elements, which may damage the OLED elements and hence can result in abnormal display of the OLED display.

In the currently common heat-conducting means, for instance, heat-conducting glue and a heat-conducting backplane are disposed on a lower surface of an OLED display panel (namely a lower surface of the OLED array substrate). But in this heat-conducting means, the heat produced by the OLED elements can be transferred to the lower surface of the OLED array substrate only by running through a plurality of layer structures of the OLED array substrate. Therefore, the heat produced by the OLED elements cannot be rapidly and effectively conducted.

SUMMARY

At least one embodiment of the disclosure provides an array substrate, comprising: a base substrate; a plurality of organic light-emitting diode (OLED) elements disposed on the base substrate; and a non-conductive layer in contact with the OLED elements, heat-conducting particles being doped in the non-conductive layer.

In some examples, the non-conductive layer includes: a planarization layer disposed on one side of the OLED element close to the base substrate, and the heat-conducting particles are doped in the planarization layer.

In some examples, a volume ratio of the heat-conducting particles doped in the planarization layer to the planarization layer is 10%-20%.

In some examples, the array substrate further includes a pixel defining layer (PDL) for separating the plurality of OLED elements, and the heat-conducting particles are doped in the PDL.

In some examples, a volume ratio of the heat-conducting particles in the PDL to the PDL is 10%-20%.

In some examples, the heat-conducting particles are nanometer heat-conducting particles.

In some examples, the heat-conducting particles are made from at least one selected from the group consisting of alumina, aluminum nitride, gallium arsenide and gallium phosphide.

In some examples, an anode layer is disposed on one side of the OLED element close to the base substrate and in contact with the planarization layer.

In some examples, the heat-conducting particles in the non-conductive layer have a heat conductivity greater than that of materials of the non-conductive layer.

At least one embodiment provides an OLED display panel comprising the array substrate as mentioned above.

At least one embodiment provides a display device comprising the OLED display panel as mentioned above.

BRIEF DESCRIPTION OF THE DRAWINGS

Simple description will be given below to the accompanying drawings of the embodiments to provide a more clear understanding of the technical proposals of the embodiments of the present disclosure. Obviously, the drawings described below only involve some embodiments of the present disclosure but are not intended to limit the present disclosure.

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. Obviously, the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

In addition, the terms "first" and "second" are only used for describing the objectives and cannot be regarded as the indication or implication of the relative importance or the implication of the number of the indicated technical characteristics. Thus, the characteristic defined by "first" or "second" may indicate or implicit that one or more characteristics are included. In the description of the present disclosure, unless otherwise indicated, "a plurality of" refers to two or more than two.

The embodiment of the present disclosure provides an array substrate, which comprises a base substrate and a plurality of OLED elements disposed on the base substrate. The array substrate further comprises a non-conductive layer in contact with the OLED elements. Heat-conducting particles are doped in the non-conductive layer.

In this way, the heat produced by the OLED elements can be rapidly dispersed to the entire OLED display panel through the heat-conducting particles in the non-conductive layer in contact with the OLED elements, so that the heat produced by the OLED elements can be rapidly conducted to an external surface of the OLED display panel, and hence the damage of the heat on the OLED elements and the display device can be avoided. Therefore, the service life of the OLED elements and the display device can be improved.

Figure 1:
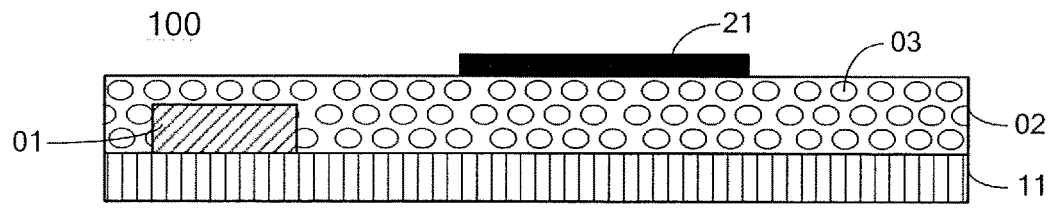
FIG. 1 is a schematic structural view 1 of an array substrate provided by the embodiment of the present disclosure.

Illustratively, FIG. 1 is a schematic structural view of an array substrate 100 provided by the embodiment of the present disclosure. The array substrate 100 comprises: a base substrate 11, thin-film transistors (TFTs) 01 distributed in an array on the base substrate 11, a planarization layer 02 disposed on the TFTs 01, and a plurality of OLED elements 21 disposed on the planarization layer 02.

At this point, the non-conductive layer may be the planarization layer 02. As illustrated in FIG. 1, heat-conducting particles 03 may be disposed in the planarization layer 02.

As illustrated in FIG. 1, as the OLED elements 21 are disposed on the planarization layer 02, the heat produced by the OLED elements 21 during operation can be rapidly conducted to the external surface of the OLED display device through the heat-conducting particles 03 in the planarization layer 02 adjacent to the OLED elements, and hence the damage of the heat on the OLED elements and the display device can be avoided.

Figure 2:
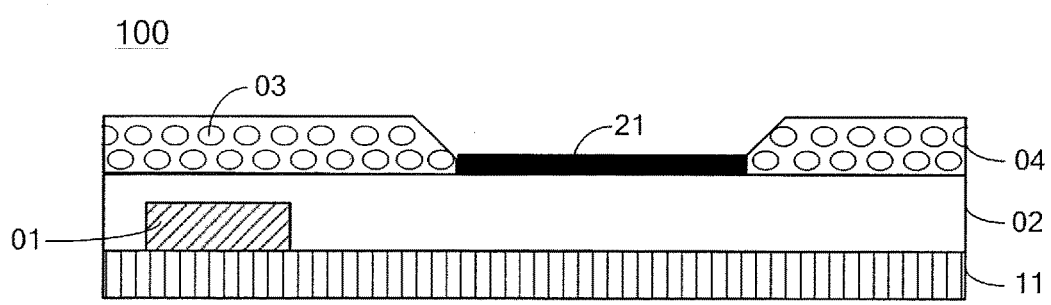
FIG. 2 is a schematic structural view 2 of the array substrate provided by the embodiment of the present disclosure.

Alternatively, similarly to the array substrate 100 as illustrated in FIG. 1, as illustrated in FIG. 2, the array substrate 100 further comprises a pixel defining layer (PDL) 4 disposed on the planarization layer 02 and configured to separate the plurality of OLED elements 21. At this point, the non-conductive layer may be the PDL 04, and the heat-conducting particles 03 may be disposed in the PDL 04.

As illustrated in FIG. 2, as the main function of the PDL 04 is to separate the OLED elements 21 in a plurality of pixel units, the PDL 04 may be in direct contact with the OLED elements 21. Thus, as the heat-conducting particles 03 are disposed in the PDL 04, the heat produced by the OLED elements 21 during operation can be rapidly dispersed to the entire OLED display panel directly through the heat-conducting particles 03 in the PDL 04, and hence the damage of the heat on the OLED elements and the display device can be avoided.

It should be noted that the heat-conducting particles 03 may also be simultaneously disposed in the planarization layer 02 and the PDL 04 and simultaneously conduct the heat produced by the OLED elements 21 during operation, so that the thermal efficiency of the entire OLED display panel can be improved.

Figure 3:
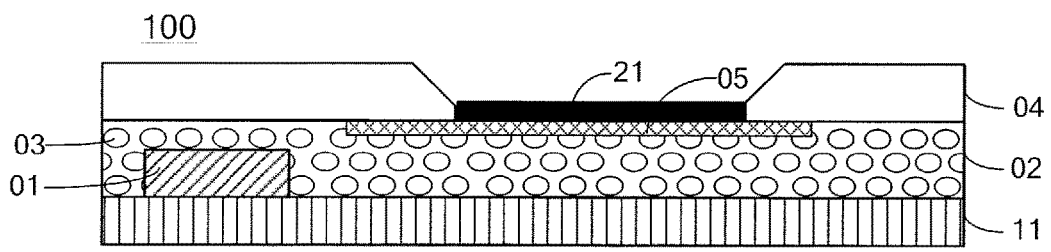
FIG. 3 is a schematic structural view 3 of the array substrate provided by the embodiment of the present disclosure.

Moreover, as illustrated in FIG. 3, an emitting anode layer 05 is disposed in the OLED element 21, may be made from metallic materials or conductive materials such as indium tin oxide (ITO) or indium zinc oxide (IZO), and is in contact with the planarization layer 02. As the emitting anode layers 05 have low thickness and high heat conductivity, the heat produced by the OLED elements 21 during operation may also be conducted through the emitting anode layers 05 and subsequently be rapidly dispersed to the entire OLED display panel through the heat-conducting particles 03 in the planarization layer 02.

Moreover, as the heat-conducting particles 03 cannot effectively disperse heat produced by the OLED elements 21 when the number is too small and cannot ensure the performances of the planarization layer 02 or the PDL 04 when the number is too large, optionally, the volume ratio of the heat-conducting particles 03 to the planarization layer 02 may be set to be 10%-20%; and similarly, the volume ratio of the heat-conducting particles 03 to the PDL 04 may be set to be 10%-20%.

Optionally, the heat-conducting particles 03 are nanometer heat-conducting particles.

The heat-conducting particles 03 are made from nonmetallic materials of which the coefficient of heat conductivity is greater than the threshold, namely the nonmetallic materials with high coefficient of heat conductivity are selected to form the heat-conducting particles 03. For instance, the heat conductivity of the heat-conducting particles is greater than that of the materials of the non-conductive layer. Therefore, the heat produced by the OLED elements may be conducted by the non-conductive layer doped with the heat-conducting particles.

For instance, the heat-conducting particles 03 may be uniformly distributed in the planarization layer 02 and/or the PDL 04.

For instance, the planarization layer 02 and the PDL 04 are made from insulating materials.

For instance, the heat-conducting particles 03 are made from alumina, aluminum nitride, gallium arsenide, gallium phosphide, etc. No limitation will be given here in the embodiment of the present disclosure.

It should be noted that: as similar to the prior art, the array substrate 100 provided by the embodiment of the present disclosure may also comprise spacers, an insulating layer, a polycrystalline silicon layer, a buffer layer, etc. As similar to the prior art, the positional relationships thereof may be set by those skilled in the art according to actual experience. No further description will be given here in the embodiment of the present disclosure.

Moreover, the embodiment of the present disclosure further provides an OLED display panel 200, which comprises any foregoing array substrate 100.

Figure 4:
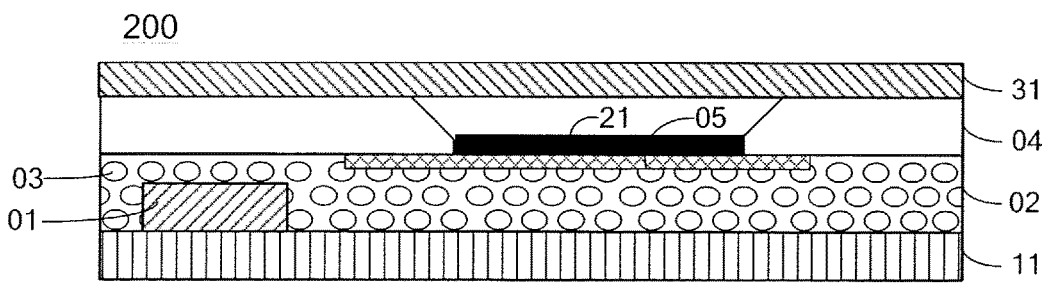
FIG. 4 is a schematic structural view of an OLED display panel provided by the embodiment of the present disclosure.

Illustratively, as illustrated in FIG. 4, the OLED display panel 200 comprises an array substrate 100 and a package substrate 31 which are arranged opposite to each other. OLED elements 21 disposed on the array substrate 100 are also disposed between the array substrate 100 and the package substrate 31.

As the heat-conducting particles are doped in the non-conductive layer of the array substrate, the heat produced by the OLED elements can be rapidly dispersed to the entire OLED display panel through the heat-conducting particles in the non-conductive layer in contact with the OLED elements, so that the heat produced by the OLED elements can be rapidly conducted to an external surface of the OLED display panel, and hence the damage of the heat on the OLED elements and the display device can be avoided. Therefore, the service life of the OLED elements and the display device can be improved.

The embodiment of the present disclosure further provides a display device, which comprises any foregoing array substrate. The display device may be: any product or component with display function such as an LCD panel, e-paper, an OLED panel, a mobile phone, a tablet PC, a TV, a display, a notebook computer, a digital picture frame and a navigator.

The embodiment of the present disclosure provides an array substrate, an OLED display panel and a display device. The array substrate comprises a base substrate and a plurality of OLED elements disposed on the base substrate. The array substrate further comprises a non-conductive layer in contact with the OLED elements. Heat-conducting particles are doped in the non-conductive layer. In this way, the heat produced by the OLED elements can be rapidly dispersed to the entire OLED display panel through the heat-conducting particles in the non-conductive layer making contact with the OLED elements, so that the heat produced by the OLED elements can be rapidly conducted to an external surface of the OLED display panel, and hence the damage of the heat on the OLED elements and the display device can be avoided. Therefore, the service life of the OLED elements and the display device can be improved.

In the description, the specific characteristics, structures, materials or features may be combined with each other by appropriate means in any one or a plurality of embodiments or examples.

The foregoing is only the preferred embodiments of the present disclosure and not intended to limit the scope of protection of the present disclosure. The scope of protection of the present disclosure should be defined by the appended claims.

The application claims priority to the Chinese patent application No. 201610086155.0, filed Feb. 15, 2016, the disclosure of which is incorporated herein by reference as part of the application.

The invention claimed is:

1. An array substrate, comprising:
a base substrate;
a plurality of organic light-emitting diode (OLED) elements disposed on the base substrate; and
a non-conductive layer in contact with the OLED elements, heat-conducting particles being doped in the non-conductive layer.

2. The array substrate according to claim 1, wherein the non-conductive layer includes: a planarization layer disposed on one side of the OLED element close to the base substrate, and the heat-conducting particles are doped in the planarization layer.

3. The array substrate according to claim 1, further comprising: a pixel defining layer (PDL) for separating the plurality of OLED elements, and the heat-conducting particles are doped in the PDL.

4. The array substrate according to claim 1, wherein the heat-conducting particles are nanometer heat-conducting particles.

5. The array substrate according to claim 1, wherein the heat-conducting particles are made from at least one selected from the group consisting of alumina, aluminum nitride, gallium arsenide and gallium phosphide.

6. The array substrate according to claim 1, wherein the heat-conducting particles in the non-conductive layer have a heat conductivity greater than that of materials of the non-conductive layer.

7. An OLED display panel, comprising the array substrate according to claim 1.

8. The array substrate according to claim 2, wherein a volume ratio of the heat-conducting particles doped in the planarization layer to the planarization layer is 10%-20%.

9. The array substrate according to claim 2, wherein an anode layer is disposed on one side of the OLED element close to the base substrate and in contact with the planarization layer.

10. The array substrate according to claim 3, wherein a volume ratio of the heat-conducting particles in the PDL to the PDL is 10%-20%.

11. The OLED display panel according to claim 7, wherein the non-conductive layer includes: a planarization layer disposed on one side of the OLED element close to the base substrate, and the heat-conducting particles are doped in the planarization layer.

12. The OLED display panel according to claim 7, further comprising: a pixel defining layer (PDL) for separating the plurality of OLED elements, and the heat-conducting particles are doped in the PDL.

13. The OLED display panel according to claim 7, wherein the heat-conducting particles are nanometer heat-conducting particles.

14. The OLED display panel according to claim 7, wherein the heat-conducting particles are made from at least one selected from the group consisting of alumina, aluminum nitride, gallium arsenide and gallium phosphide.

15. The OLED display panel according to claim 7, wherein the heat-conducting particles in the non-conductive layer have a heat conductivity greater than that of materials of the non-conductive layer.

16. A display device, comprising the OLED display panel according to claim 7.

17. The OLED display panel according to claim 11, wherein a volume ratio of the heat-conducting particles doped in the planarization layer to the planarization layer is 10%-20%.

18. The OLED display panel according to claim 11, wherein an anode layer is disposed on one side of the OLED element close to the base substrate and in contact with the planarization layer.

19. The OLED display panel according to claim 12, wherein a volume ratio of the heat-conducting particles in the PDL to the PDL is 10%-20%.

* * * * *